United States Patent
Chen et al.

(10) Patent No.: US 9,625,511 B2
(45) Date of Patent: Apr. 18, 2017

(54) POWER DISTRIBUTION UNIT AND ALARM

(71) Applicant: International Business Machines Corporation, Armonk, NY (US)

(72) Inventors: Wei T. Chen, Taipei (TW); Yulianti Darmanto, Taipei (TW); Cheng-Hao Lin, Taipei (TW); Y. K. Liu, Taipei (TW); Claire HW Tsai, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/746,983

(22) Filed: Jun. 23, 2015

(65) Prior Publication Data

US 2015/0371525 A1 Dec. 24, 2015

(30) Foreign Application Priority Data

Jun. 24, 2014 (TW) .............................. 103122054 A

(51) Int. Cl.
| | |
|---|---|
| *G08B 21/00* | (2006.01) |
| *G01R 31/02* | (2006.01) |
| *G08B 21/18* | (2006.01) |
| *G01R 31/04* | (2006.01) |

(52) U.S. Cl.
CPC ......... *G01R 31/024* (2013.01); *G01R 31/025* (2013.01); *G01R 31/045* (2013.01); *G08B 21/185* (2013.01)

(58) Field of Classification Search
CPC .... G08B 21/185; G08B 13/1409; H02H 3/04; G01R 19/14

USPC ......... 340/649, 679, 12.32, 687; 361/50, 42, 361/102, 220; 324/508

See application file for complete search history.

(56) References Cited

U.S. PATENT DOCUMENTS

| | | | |
|---|---|---|---|
| 3,644,912 A * | 2/1972 | Allen, Jr. ............... | G08B 13/22 340/538 |
| 3,728,581 A * | 4/1973 | Adamo ............. | H01R 13/7135 340/650 |

(Continued)

FOREIGN PATENT DOCUMENTS

| | | |
|---|---|---|
| CN | 101814223 A | 8/2010 |
| CN | 202676825 U | 1/2013 |

(Continued)

OTHER PUBLICATIONS

Bender International Products, "Ground-Fault & Neutral Grounding Resistor Monitor for AC Systems in Mining Applications", www.bender.org, pp. 1-6.

*Primary Examiner* — Hoi Lau
(74) *Attorney, Agent, or Firm* — Lieberman & Brandsdorfer, LLC

(57) ABSTRACT

A power distribution unit including a base, at least one socket, at least one detecting unit and a management unit is provided. The socket is disposed at the base and has at least one power end and a ground end. The detecting unit is disposed at the base. When a plug is disposed at the socket, the detecting unit outputs an alarm signal if the plug is electrically connected to the power end of the socket but the plug is not electrically connected to the ground end of the socket. The management unit is electrically connected to the detecting unit and performs a predetermined operation in response to the alarm signal.

9 Claims, 3 Drawing Sheets

(56) References Cited

U.S. PATENT DOCUMENTS

| | | | | |
|---|---|---|---|---|
| 3,924,914 A * | 12/1975 | Banner | G01R 19/14 | 340/641 |
| 4,059,843 A * | 11/1977 | Girismen | G08B 13/1409 | 307/326 |
| 4,075,617 A * | 2/1978 | Wireman | G08B 13/1409 | 200/51.1 |
| 4,111,516 A * | 9/1978 | Wireman | H01R 13/648 | 324/508 |
| 4,298,864 A * | 11/1981 | Mahnke | G01R 19/16571 | 340/649 |
| 4,318,578 A * | 3/1982 | Ericson | H01R 13/717 | 439/106 |
| 4,447,844 A * | 5/1984 | Schossow | H02H 11/001 | 307/326 |
| 5,099,212 A * | 3/1992 | Nagaishi | G01R 27/20 | 324/133 |
| 5,269,697 A * | 12/1993 | Essex | H01R 13/443 | 439/135 |
| 5,434,558 A * | 7/1995 | Zeder | G08B 13/1409 | 200/51.1 |
| 5,642,248 A * | 6/1997 | Campolo | H01R 13/7135 | 361/115 |
| 5,892,974 A * | 4/1999 | Koizumi | A63F 13/06 | 710/16 |
| 6,462,555 B1 * | 10/2002 | Schaefer | G01R 31/024 | 324/508 |
| 6,987,659 B1 * | 1/2006 | Epstein | H05K 9/0066 | 361/212 |
| 7,193,837 B1 * | 3/2007 | Epstein | H01R 4/66 | 361/220 |
| 8,125,345 B2 | 2/2012 | Curt et al. | | |
| 8,461,492 B1 * | 6/2013 | Briones, Jr. | H05B 1/0261 | 219/491 |
| 8,742,943 B2 * | 6/2014 | Garb | H02H 9/042 | 323/301 |
| 9,007,186 B1 * | 4/2015 | Krummey | G06F 1/266 | 340/12.32 |
| 2002/0057089 A1 * | 5/2002 | Brown | G01R 31/041 | 324/508 |
| 2006/0152379 A1 * | 7/2006 | Lewis | H02H 3/04 | 340/679 |
| 2007/0086126 A1 * | 4/2007 | Baxter | H02H 11/005 | 361/42 |
| 2010/0033908 A1 | 2/2010 | Fernald, Jr. | | |
| 2010/0317222 A1 * | 12/2010 | Tom | H01R 13/652 | 439/490 |
| 2011/0187552 A1 * | 8/2011 | Garb | H02H 9/042 | 340/815.45 |
| 2012/0170292 A1 * | 7/2012 | Bhosale | H01R 13/6658 | 362/415 |
| 2012/0320485 A1 * | 12/2012 | Huang | H02H 3/33 | 361/114 |
| 2014/0375328 A1 * | 12/2014 | Lenzie | G01R 31/041 | 324/508 |
| 2015/0371525 A1 * | 12/2015 | Chen | G08B 21/185 | 340/649 |
| 2016/0054367 A1 * | 2/2016 | Chen | G08B 21/185 | 340/649 |

FOREIGN PATENT DOCUMENTS

| | | |
|---|---|---|
| EP | 0976234 A2 | 2/2000 |
| EP | 1000500 A2 | 5/2000 |
| EP | 1226495 A2 | 7/2002 |
| TW | 527756 | 4/2003 |
| TW | 201123650 | 7/2011 |
| TW | 201135245 A | 10/2011 |
| TW | 201136070 | 10/2011 |
| TW | 201222484 | 6/2012 |

* cited by examiner

POWER DISTRIBUTION UNIT AND ALARM

CROSS-REFERENCE TO RELATED APPLICATION(S)

This application is based on and claims the benefit of priority from Taiwan Patent Application 103122054 filed on Jun. 24, 2014, which is incorporated herein by reference and assigned to the assignee herein.

BACKGROUND

The present embodiments relates to a power distribution unit and in particular, to an alarm method applied in the power distribution unit.

DESCRIPTION OF THE PRIOR ART

For the existing power distribution unit (also called PDU), please refer to IBM's power distribution unit products, such as PDU+.

In general, a power distribution unit is provided with an external cable to be electrically connected to a fixed power, e.g. a voltage source of 110 V or 220 V. In addition, the power distribution unit is usually provided with a plurality of sockets such that plugs of various electronic devices can be inserted in the sockets and the required electricity power can be provided to each of the electronic devices.

However, in some cases, the plug of an electronic device is not provided with a ground end, or the ground end is often deliberately removed by a user. Therefore, if a plug of an electronic device which does not have a ground end is used to be inserted into a socket of a power distribution unit, when encountering a high voltage injection due to lightning, voltage surges or unintentional voltage contact, the electronic device cannot be protected by means of the overvoltage protection such that sparks can easily occur as the plug is inserted in or removed from the socket. Furthermore, in case of voltage instability, the electronic device is likely to be damaged due to voltage surges, and results in an electric shock to a user due to electrical leakage.

SUMMARY

The present embodiments include a power distribution unit and an associated computer program product for applying an alarm to the power distribution unit.

The power distribution unit is configured with a socket having a power end and a ground end. A detecting unit is provided to output an alarm signal if a plug disposed at the socket is electrically connected to the power end of the socket but the plug is not electrically connected to the ground end. In addition, a management unit is provided electrically connected to the detecting unit. More specifically, the management unit functions to perform an operation in response to the alarm signal.

These and other features and advantages will become apparent from the following detailed description of the presently preferred embodiment(s), taken in conjunction with the accompanying drawings.

BRIEF DESCRIPTION OF THE DRAWINGS

In order that the advantages of the embodiments will be readily understood, a more particular description of the embodiments briefly described above will be rendered by reference to specific embodiments that are illustrated in the appended drawings. Understanding that these drawings depict only typical embodiments and are not therefore to be considered to be limiting of its scope, the embodiments will be described and explained with additional specificity and detail through the use of the accompanying drawings.

DETAILED DESCRIPTION

Hereinafter, the present embodiments will be described in more detail with reference to the accompanying drawings. Nevertheless, it should be understood that the present embodiments could be modified by those skilled in the art in accordance with the following description to achieve the excellent results of the present embodiments. Therefore, the following description shall be considered as a pervasive and explanatory disclosure related to the present embodiments for those skilled in the art, not intended to limit the claims of the present embodiments.

Citation of "a specific embodiment" or a similar expression in the specification means that specific features, structures, or characteristics described in the specific embodiment are included in at least one specific embodiment of the present embodiments. Hence, the wording "in a specific embodiment" or a similar expression in this specification does not necessarily refer to the same specific embodiment.

Reference throughout this specification to features, advantages, or similar language does not imply that all of the features and advantages that may be realized with the present embodiments should be or are in any single embodiment of the embodiments. Rather, language referring to the features and advantages is understood to mean that a specific feature, advantage, or characteristic described in connection with an embodiment is included in at least one embodiment of the present embodiments. Thus, discussion of the features and advantages, and similar language, throughout this specification may, but do not necessarily, refer to the same embodiment.

Furthermore, the described features, advantages, and characteristics of the embodiments may be combined in any suitable manner in one or more embodiments. One skilled in the relevant art will recognize that the embodiments may be practiced without one or more of the specific features or advantages of a particular embodiment. In other instances, additional features and advantages may be recognized in certain embodiments that may not be present in all embodiments.

The following description and the appended claims further illustrate the features and advantages of the present embodiments.

[Structure of the Power Distribution Unit]

Figure 1:
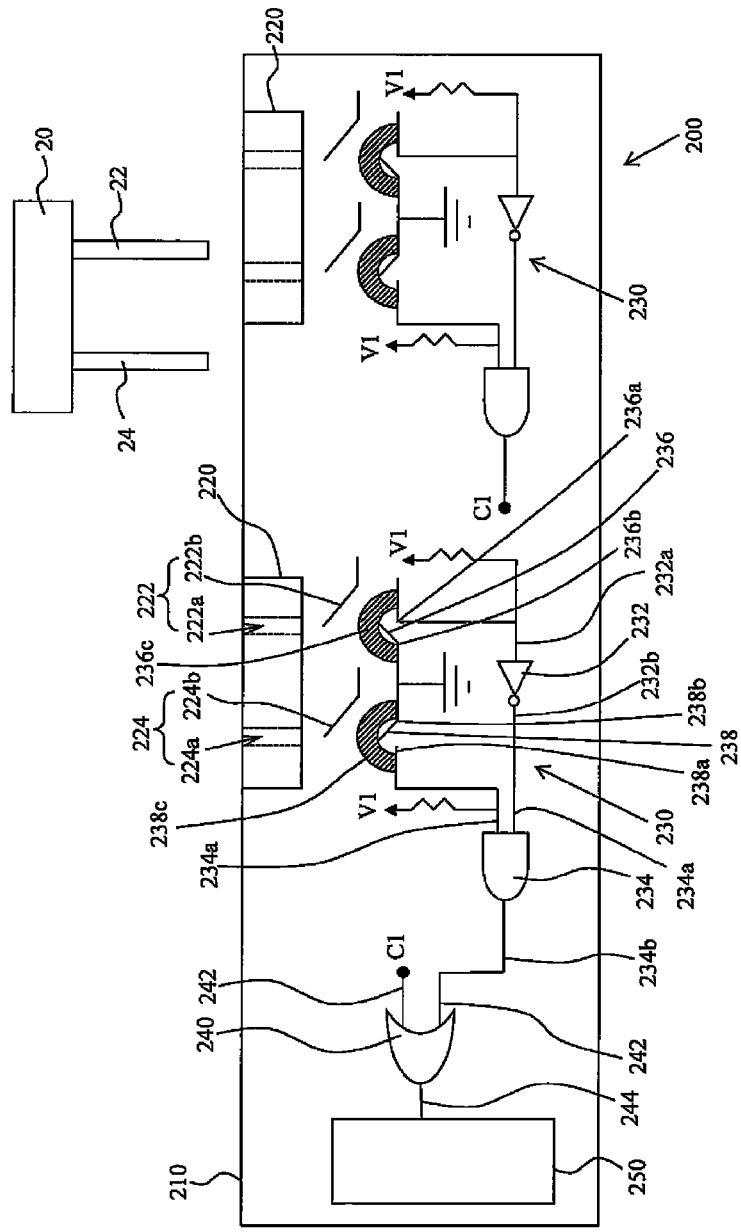
FIG. 1 depicts a schematic diagram of a power distribution unit according to an embodiment.

Referring to FIG. 1, a schematic diagram of a power distribution unit (200) is provided according to an embodiment. The power distribution unit (200) includes a base (210), at least a socket (220) (a plurality of sockets (220) are shown in FIG. 1), at least one detecting unit (230) (a plurality of detecting units (230) are shown in FIG. 1), an OR gate (240), a management unit (250) and an external cable (not shown). Each of the sockets (220) is disposed at the base (210) and includes at least one power end (222)

(two power ends (222) are usually included but only one is schematically illustrated in FIG. 1) and a ground end (224).

In an embodiment, the power end (222) of each of the sockets (220) may include a power jack (222a) and a power elastic piece (222b) located near the power jack (222a). The ground end (224) of each of the sockets (220) may include a ground jack (224a) and a ground elastic piece (224b) located near the ground jack (224a). In addition, a plug (20) of an external electronic device (e.g. a server such as IBM's System X, Blade Center or eServer, but not shown) is adapted to be disposed at one of the sockets (220). The plug (20) of the external electronic device may include at least one power end (22) (two power ends (22) are usually included but only one is schematically illustrated in FIG. 1) and a ground end (24). In an embodiment, the power end (22) and the ground end (24) of the plug (20) may be pins, respectively.

The detecting units (230) are disposed at the base (210) and respectively correspond to the sockets (220). In the present embodiment, each of the detecting units (230) includes an inverter (232), an AND gate (234), a first switch (236) and a second switch (238). In each of the detecting units (230), the inverter (232) includes an input end (232a) and an output end (232b). The AND gate (234) includes two input ends (234a) and an output end (234b). The first switch (236) includes a first end (236a), a second end (236b) and an insulating elastomer (236c), and the second switch (238) includes a first end (238a), a second end (238b) and an insulating elastomer (238c). When the power distribution unit (200) is in the initial state, that is, all sockets (220) are not inserted with any plugs, both the first switch (236) and the second switch (238) are open.

In each of the detecting units (230), one of the input ends (234a) of the AND gate (234) is electrically connected to the output end (232b) of the inverter (232), and the first end (236a) of the first switch (236) is electrically connected to the input end (232a) of the inverter (232). In each of the detecting units (230), the first end (236a) of the first switch (236) and the input end (232a) of the inverter (232) are together electrically connected to a preset power V1, and the second end (236b) of the first switch (236) is grounded. The first switch (236) of each of the detecting units (230) corresponds to the power end (222) of one of the sockets (220).

In each of the detecting units (230), the first end (238a) of the second switch (238) is electrically connected to another of the input ends (234a) of the AND gate (234). In each of the detecting units (230), the first end (238a) of the second switch (238) and the other input end (234a) of the AND gate (234) are together electrically connected to a preset power V1, and the second end (238b) of the second switch (238) is grounded. The second switch (238) of each of the detecting units (230) corresponds to the ground end (224) of one of the sockets (220).

The output end (234b) of the AND gate (234) of each of the detecting units (230) is electrically connected to one of a plurality of input ends (242) of the OR gate (240). An output end (244) of the OR gate (240) is electrically connected to the management unit (250). The management unit (250) is used for determining whether to perform a predetermined operation according to a signal transmitted from the output end (244) of the OR gate (240). The predetermined operation is, for example, to generate a visual alarm message (e.g. to turn on an alarm light) or an auditory alarm sound (e.g. to issue an alarm noise). The details will be described hereinafter.

In other embodiments, the number of the sockets (220) and that of the detecting units (230) may vary. When the number of the socket (220) and that of the detecting unit (230) is one, respectively, the OR gate (240) can be omitted and the output end (234b) of the AND gate (234) of the detecting unit (230) can be electrically connected to the management unit (250) directly.

[Operation of the Power Distribution Unit]

The operation of the power distribution unit (200) will be described hereinafter. Please refer to FIG. 1. When the power distribution unit (200) is in the initial state (i.e. no plug is inserted into any of the sockets (220)), the output ends (234b) of the AND gates (234) of all the detecting units (230) respectively output first signals (e.g. a low voltage signal), and the management unit (250) does not generate a visual alarm message (or an auditory alarm sound) according to a signal transmitted from the output end (244) of the OR gate (240). In one embodiment, the aspect of not generating an alarm message is also referred to as deterring the generation of the alarm message.

Figure 2:
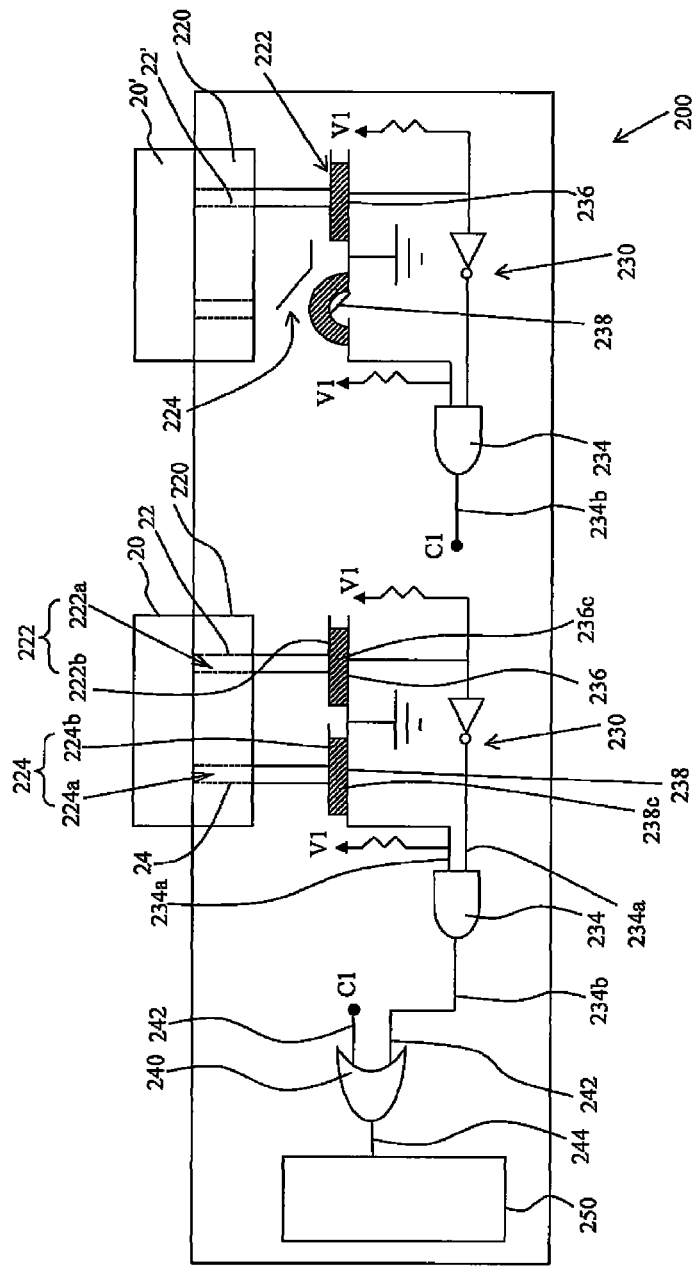
FIG. 2 depicts a schematic diagram showing the sockets of the power distribution unit where the plugs are inserted according to an embodiment.

Referring to FIG. 2, which is a schematic diagram showing the sockets of the power distribution unit where the plugs are inserted according to an embodiment. As shown in FIG. 2, the plugs (20) and (20') are respectively inserted into the sockets (220) of the power distribution unit (200). The power end (22) and the ground end (24) of the plug (20) are respectively electrically connected to the power end (222) and the ground end (224) of the corresponding socket (220) such that both the first switch (236) and second switch (238) of the corresponding detecting unit (230) are short. Accordingly, the output end (234b) of the AND gate (234) of the corresponding detecting unit (230) outputs a first signal (e.g. a low voltage signal).

It should be noted here that, in the present embodiment, when the power end (220 and the ground end (24) of the plug (20) are respectively inserted into the power jack (222a) and ground jack (224a) of the corresponding socket (220), the power end (22) and the ground end (24) of the plug (20) respectively press and are electrically connected to the corresponding power elastic piece (222b) and the corresponding ground elastic piece (224b). At this time, the corresponding power elastic piece (222b) and the corresponding ground elastic piece (224b) are electrically connected to a power line and a ground line of an external cable (not shown) respectively, and press the insulating elastomer (236c) of the corresponding first switch (236) and the insulating elastomer (238c) of the corresponding second switch (238), respectively such that the two ends (236a) and (236b) of the corresponding first switch (236) (see FIG. 1) are electrically conductive and the two ends (238a) and (238b) of the corresponding second switch (238) (see FIG. 1) are electrically conductive.

Referring to FIG. 2 again. The power end (22') of the plug (20') is electrically connected to the power end (222) of the corresponding socket (220) such that the corresponding first switch (236) is short. However, the plug (20') is not electrically connected to the ground end (224) of the corresponding socket (220) such that the corresponding second switch (238) is still open. Accordingly, the output end (234b) of the AND gate (234) of the corresponding detecting unit (230) outputs a second signal (that is, an alarm signal, e.g. a high voltage signal).

Based on the above mentioned, since one of the detecting units (230) corresponding to the sockets (220) outputs the alarm signal to the OR gate (240) and the output end (244) of the OR gate (240) then transmits the alarm signal to the management unit (250), the management unit (250) performs a predetermined operation in response to the alarm signal. The predetermined operation is, for example, to generate a visual alarm message (e.g. to turn on an alarm light) or an auditory alarm sound (e.g. to issue an alarm noise) to alert the user.

Based on the aforementioned, in the case that a plug is inserted into the power distribution unit (200) in the present embodiment, as long as the power end (222) of the corresponding socket (220) is electrically connected to the plug but the ground end (224) of the corresponding socket (220) is not electrically connected to the plug, the management unit (250) of the power distribution unit (200) generates a visual alarm message (e.g. turns on an alarm light) or an auditory alarm sound (e.g. issues an alarm noise) to alert the user. In addition, in the case that in the present embodiment no plug is inserted into the power distribution unit (200) or the inserted plug is electrically connected to both the power end (222) and the ground end (224) of the corresponding socket (220), the management unit (250) does not generate the aforementioned alarm message or alarm sound.

[An Alarm Method Applied in the Power Distribution Unit]

Figure 3:
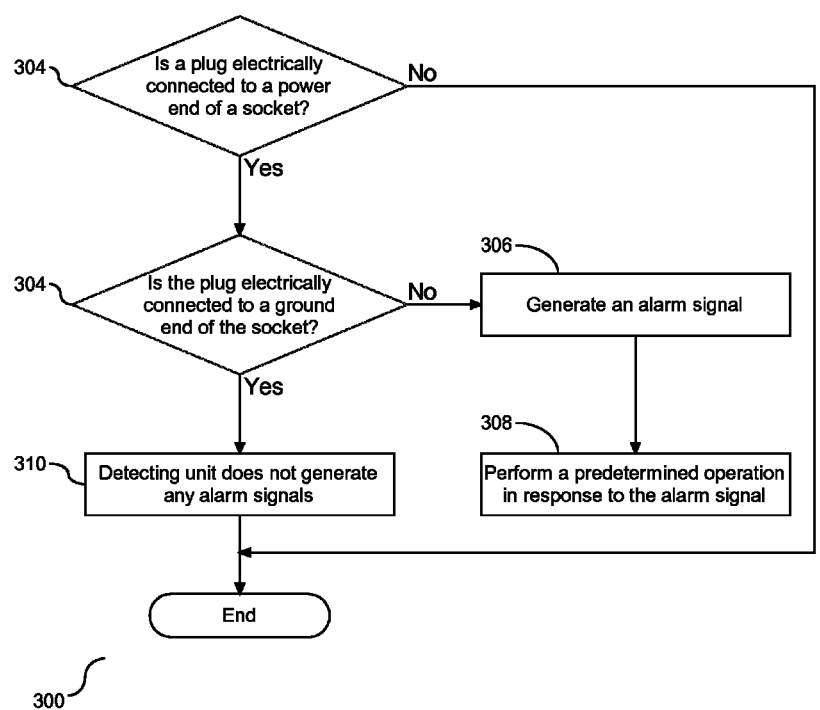
FIG. 3 depicts a flowchart illustrating the alarm method applied in the power distribution unit according to an embodiment.

An alarm method applied in the power distribution unit (200) is described hereinafter. FIG. 3 is a flowchart (300) illustrating the alarm method applied in the power distribution unit according to an embodiment. Please refer to FIG. 1 to FIG. 3. The alarm method applied in the power distribution unit according to an embodiment of the present embodiments includes the following steps. First, Step (302) is performed. The electrical connection between a plug and the power end (222) of the corresponding socket (220) of the power distribution unit (200) is determined. Then, if the plug is electrically connected to the power end (222) of the corresponding socket (220), Step (304) is performed, i.e. the electrical connection between the plug and the ground end (224) of the corresponding socket (220) is determined. Next, if the plug is not electrically connected to the ground end (224) of the corresponding socket (220), Step (306) is performed, i.e. the corresponding detecting unit (230) generates an alarm signal, followed by Step (308) wherein the management unit (250) performs a predetermined operation in response to the alarm signal. The predetermined operation is, for example, to generate a visual alarm signal (e.g. to turn on an alarm light) or an auditory alarm sound (e.g. to issue an alarm noise) to alert the user. If at step (304), it is determined that the plug is electrically connected to a ground end of the socket, the detecting unit does not generate any alarming signal(s) (310).

In the present embodiment, if the plug is not electrically connected to the power end (222) of any socket (220) (e.g. the power distribution unit 200 is in the initial state as shown in FIG. 1), all the detecting units (230) do not generate any alarm signals. If the plug is electrically connected to the ground end (224) of the corresponding socket (220), the corresponding detecting unit (230) does not generate an alarm signal.

The present embodiment(s) has one of the following advantages or another advantage. In the case that a plug is inserted into the power distribution unit in an embodiment of the present embodiments, as long as the power end of the corresponding socket is electrically connected to the plug but the ground end of the corresponding socket is not electrically connected to the plug, the corresponding detecting unit outputs an alarm signal. In response to the alarm signal, the management unit of the power distribution unit generates a visual alarm message or an auditory alarm sound to alert the user.

In addition, in the case that in an embodiment no plug is inserted into the power distribution unit or the inserted plug is electrically connected to both the power end and the ground end of the corresponding socket, all the detecting units do not output any alarm signals. The management unit does not generate any alarm message or alarm sound.

As will be appreciated by one skilled in the art, the present embodiments may be embodied as a computer system, a method or a computer program product. Accordingly, the present embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present embodiments may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server.

The present embodiments are described below with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The foregoing detailed description of the embodiments is used to further clearly describe the features and spirit of the present embodiments. The foregoing description for each embodiment is not intended to limit the scope of the present embodiments. All kinds of modifications made to the foregoing embodiments and equivalent arrangements should fall within the protected scope of the present embodiments. Hence, the scope of the present embodiments should be explained most widely according to the claims described thereafter in connection with the detailed description, and should cover all the possibly equivalent variations and equivalent arrangements.

What is claimed is:

1. A power distribution unit, comprising:
   a base;
   at least one socket, disposed at the base and having at least one power end and a ground end;
   at least one detecting unit, disposed at the base, wherein when a plug is disposed at the socket, the detecting unit to output a second voltage signal if the plug is electrically connected to the power end of the socket but the plug is electrically disconnected from the ground end of the socket and the detecting unit to output a first voltage signal based on the condition selected from the group consisting of: the plug electrically connected to both the power end and ground end of the socket and the plug disconnected from the power end of the socket; and
   a management unit, electrically connected to the detecting unit, the management unit to perform a predetermined operation in response to the voltage signal.

2. The power distribution unit as claimed in claim 1, wherein the detecting unit further comprising:
   an inverter;
   an AND gate, an input end of the AND gate being electrically connected to an output end of the inverter, and an output end of the AND gate being suitable to output a second voltage signal;
   a first switch, corresponding to the power end of the socket, wherein one end of the first switch is electrically connected to an input end of the inverter, the one end of the first switch and the input end of the inverter are together electrically connected to a preset power, and another end of the first switch is grounded; and
   a second switch, corresponding to the ground end of the socket, wherein one end of the second switch is electrically connected to the input end of the AND gate, the one end of the second switch and the other input end of the AND gate are together electrically connected to the preset power, and another end of the second switch is grounded;
   when the plug is not disposed at the socket, the first switch and the second switch are open; and
   when the plug is electrically connected to the power end of the socket to cause the first switch to be short and the plug is electrically disconnected from the ground end of the socket such that the second switch is still open, the output end of the AND gate to output the second voltage signal.

3. A power distribution unit comprising:
   a base;
   a plurality of sockets, disposed at the base and each socket having at least one power end and one ground end;
   a plurality of detecting units, disposed at the base, wherein when a plug is disposed at one of the sockets, the detecting unit to output an alarm signal if the plug is electrically connected to the power end of one of the sockets but the plug is electrically disconnected from to the ground end of one of the sockets;
   an OR gate, wherein the sockets correspond to the detecting units respectively, one end of each of the detecting units suitable to output the alarm signal is electrically connected to one of a plurality of input ends of the OR gate, and an output end of the OR gate is electrically connected to the management unit; and
   in response to one of the detecting units outputting the alarm signal to the OR gate, the OR gate to transmit the alarm signal to the management unit, the management unit to perform a predetermined operation.

4. The power distribution unit as claimed in claim 1, wherein the predetermined operation performed by the management unit is to generate a communication selected from the group consisting of: a visual alarm and an auditory alarm.

5. A computer program product for employing an alarm in a power distribution unit, the computer program product comprising a computer readable storage device having program code embodied therewith, the program code executable by a processing unit to:
   determine an electrical connection between a plug disposed at a socket of the power distribution unit and a power end of the socket;
   determine the electrical connection between the plug and a ground end of the socket if the plug is electrically connected to the power end of the socket;
   generate a first voltage signal based on the conditions selected from the group consisting of: the plug being connected to both the power end and ground end of the socket and the plug being electrically disconnected from the power end of the socket; and
   generate a second voltage signal if the plug is electrically disconnected from the ground end of the socket and is connected to the power end of the socket; and
   perform a predetermined operation in response to the first and second voltage signals.

6. The computer program product as claimed in claim 5, wherein the predetermined operation is to generate a communication selected from the group consisting of: a visual alarm and an auditory alarm.

7. The computer program product as claimed in claim 5, further comprising configuring a plurality of sockets and an OR gate in communication with the sockets, and in response to the OR gate receiving the alarming signal, program code performing the predetermined operation.

8. The device of claim 1 wherein the first voltage signal is a low voltage signal.

9. The device of claim 1 wherein the second voltage signal is a high voltage signal.

* * * * *